(12) United States Patent
Yamamoto et al.

(10) Patent No.: US 7,388,434 B2
(45) Date of Patent: Jun. 17, 2008

(54) BTL AMPLIFIER

(75) Inventors: Makoto Yamamoto, Mishima-gun (JP); Keiichi Fujii, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 15 days.

(21) Appl. No.: 11/267,256

(22) Filed: Nov. 7, 2005

(65) Prior Publication Data

US 2006/0097785 A1 May 11, 2006

(30) Foreign Application Priority Data

Nov. 10, 2004 (JP) ............................. 2004-326939

(51) Int. Cl.
*H03F 3/14* (2006.01)
(52) U.S. Cl. ...................... 330/307; 330/146
(58) Field of Classification Search ................ 330/307, 330/66, 72, 77, 146
See application file for complete search history.

(56) References Cited

U.S. PATENT DOCUMENTS 4,355,287 A * 10/1982 Hoover ....................... 330/264
4,910,477 A * 3/1990 Gross ......................... 330/263
5,600,575 A * 2/1997 Anticole ..................... 702/132
6,005,438 A * 12/1999 Shing ......................... 330/253

FOREIGN PATENT DOCUMENTS

JP 61-142763 6/1986
JP 2-132838 5/1990

* cited by examiner

*Primary Examiner*—Henry K Choe
(74) *Attorney, Agent, or Firm*—Wenderoth, Lind & Ponack, L.L.P.

(57) ABSTRACT

In a BTL amplifier of the present invention, between first and third transistor parts which are laterally adjacent, directions of semiconductor regions are parallel. Between the first and second transistor parts and the third and fourth transistor parts, each which are longitudinally adjacent, directions of semiconductor regions are perpendicular. The first and the third transistor parts are connected to a power supply terminal through a first wire. The second and the fourth transistor parts are connected to a ground terminal through a second wire. The first and the second transistor parts are connected to a first output terminal through a third wire. The third and the fourth transistor parts are connected to a second output terminal through a fourth wire.

7 Claims, 7 Drawing Sheets

BTL AMPLIFIER

BACKGROUND OF THE INVENTION

1. Field of the Invention

The present invention relates to a BTL (balanced transformer-less or bridge-tied load) amplifier, in particular, relates to a BTL amplifier composed of semiconductor integrated circuits.

2. Description of the Related Art

A BTL amplifier has been generally in use for a power amplifier for an electronic device of relatively high power consumption such as an audio equipment, an audio output device of a television receiver, or the like. The BTL amplifier includes two output circuits, each having a single output, and drives those circuits in an opposite phase in relation to each other. A load such as a speaker or the like is connected between output terminals of the output circuits. This causes the amplitude of an individual voltage output from each output circuit to be half of the amplitude of a total voltage to be applied to the load. Allowing a half voltage amplitude means lowering power consumption of each output circuit. As described above, since a withstand voltage or a current capacity of a circuit element of the BTL amplifier is smaller than that of an amplifier having a single output, the BTL amplifier facilitates miniaturization and power saving. These features particularly have an advantage in circuit integration.

In recent years, the BTL amplifier is frequently in use for a portable information-processing device such as a mobile phone or the like due to the above-mentioned features.

FIG. 6 is one example of a plan view of an output transistor included in a BTL amplifier of a prior art (see the Japanese patent laid-open publications No. 61-142763 and 2-132838.)

An output transistor 100 of this BTL amplifier is mounted in a rectangular region on a substrate. The rectangular region is divided into four rectangular parts 10, 11, 12 and 13 in lattice patterns. Each of the rectangular parts 10, 11, 12 and 13 is equivalent to a single transistor. The rectangular parts 10, 11, 12 and 13 are hereinafter referred to as transistor parts.

FIG. 7 is a plan view showing a layout of three semiconductor regions 102, 104 and 106 for a transistor part 10 of FIG. 6 included in the BTL amplifier of the prior art. In each of transistor parts 10, 11, 12 and 13, as shown in FIG. 7, semiconductor regions 102, 104 and 106 which are laterally parallel to each other are located repeatedly in a longitudinal direction. For example, the semiconductor regions 102, 104 and 106 are n-type semiconductor region, n-type semiconductor region and p-type semiconductor region, and compose a collector region, an emitter region, and a base region of an NPN transistor, respectively. Contacts 103 and 105 are located in the semiconductor regions 102 and 104, respectively.

As shown in FIG. 6, a power supply terminal 1 is provided at an edge of the transistor part 10. The power supply terminal 1 is connected to an external constant voltage source (not shown) and is kept at a constant potential. A ground terminal 2 is provided at an edge between the transistor parts 11 and 13. Output terminals 3 and 4 are provided at each edge of the transistor parts 11 and 13. An external load such as a speaker or the like is connected between the output terminals 3 and 4.

The four transistor parts 10, 11, 12 and 13 are covered with four wires 51, 52, 53 and 54.

These wires 51, 52, 53 and 54 are preferably a metal wire layer made of aluminum or the like and composed by a multi-layer wiring process. The four transistor parts 10, 11, 12 and 13 are connected to the power supply terminal 1, the ground terminal 2, and the two output terminals 3 and 4 through the four wires 51, 52, 53 and 54, as follows.

In the transistor parts 10 and 12 which are laterally adjacent to each other, the collector region 102 is connected to the wire 51 through the contact 103. The wire 51 is connected to the power supply terminal 1. In the transistor parts 11 and 13 which are laterally adjacent to each other, the emitter region 104 is connected to the wire 52 through the contact 105. The wire 52 is connected to the ground terminal 2. The emitter region 104 of the transistor part 10 is connected to the wire 53 through the contact 105, and the collector region 102 of the transistor part 11 is connected to the wire 53 through the contact 103.

The wire 53 is connected to the output terminal 3. The emitter region 104 of the transistor part 12 is connected to the wire 54 through the contact 105, and the collector region 102 of the transistor part 13 is connected to the wire 54 through the contact 103. The wire 54 is connected to the output terminal 4.

Therefore, the transistor parts 10 and 11 are equivalent to two transistors connected in series across the power supply terminal 1 and the ground terminal 2, and constitute one push-pull type output circuit. In a similar way, the transistor parts 12 and 13 are equivalent to two transistors connected in series across the power supply terminal 1 and the ground terminal 2, and constitute another push-pull type output circuit.

The base regions 106 of the four transistor parts 10, 11, 12 and 13 are connected to external preamplifiers (not shown) through other wires which are different from the four wires 51, 52, 53 and 54. A push-pull operation for the transistor parts 12 and 13 and that for the transistor parts 10 and 11 are controlled in opposite phase to each other through the preamplifiers. That is, two push-pull type output circuits are driven in opposite phase to each other. As a result, voltage amplitude of an output voltage output across the two output terminals 3 and 4 is twice as large as amplitude of individual electrical potential change of respective output terminals 3 and 4.

For further improved integration of the transistor parts 10, 11, 12 and 13, further miniaturization of the wires 51, 52, 53 and 54 is required.

However, in the BTL amplifier of the prior art, positions to locate the power supply terminal 1, the ground terminal 2, and the two output terminals 3 and 4 for the transistor parts 10, 11, 12 and 13 are limited to positions shown in FIG. 6, for example. In particular, the power supply terminal 1 is located apart as far as it can be from the other terminals 2, 3 and 4 to prevent short-circuiting between the power supply terminal 1 and the other terminals 2, 3 and 4. On the other hand, the wires 53 and 54 extend linearly in parallel to longitudinal direction of the transistor parts 10, 11, 12 and 13, namely in a direction perpendicular to the lateral semiconductor regions 102, 104 and 106 included in the respective transistor parts 10, 11, 12 and 13, or in a longitudinal direction in FIG. 6. As a result, the wire 51 has to protrude outside of the transistor parts 10 and 12 so as to keep the wire 51 apart as far as it can be from both the wires 53 and 54 and prevent short-circuiting between the wire 51 and the others. That is, the wire 51 has to be longer than the other wires. The longer the wires are, the larger the wire resistances become. Therefore, it is difficult to further improve integration degree with keeping wire resistance low. The above-mentioned wire resistance rise is not preferable since the wire resistance rise increases power loss and reduces power to be output.

BRIEF SUMMARY OF THE INVENTION

The main object of the present invention is to provide a BTL amplifier that reduces wire resistance by limiting location range of wires within a region on which an output transistor is mounted so as to improve both integration degree and output power.

A BTL amplifier according to the first aspect of present invention includes a substrate, and first, second, third and fourth transistor parts which are four rectangular parts substantially dividing a rectangular region on the substrate in lattice patterns, and each of the rectangular parts including a transistor consisting of three n-type or p-type semiconductor regions which are longitudinally or laterally parallel in each rectangular part. The BTL amplifier according to the $1^{st}$ aspect also includes a power supply terminal, a ground terminal, first and second output terminals to be connected to an external load. In addition, the BTL amplifier includes four wires, the first wire for connecting the first and the third transistor parts which are adjacent to each other in a lateral direction of the substrate to the power supply terminal, the second wire for connecting the second and the fourth transistor parts which are adjacent to each other in a lateral direction of the substrate to the ground terminal, the third wire for connecting the first and the second transistor parts which are adjacent to each other in a longitudinal direction of the substrate to the first output terminal, and the fourth wire for connecting the third and the fourth transistor parts which are adjacent to each other in a longitudinal direction of the substrate to the second output terminal.

In this BTL amplifier, the first and second transistor parts are equivalent to two transistors that are connected in series across the power supply terminal and the ground terminal, and constitute one push-pull type output circuit. In a similar way, the third and fourth transistor parts are equivalent to two transistors that are connected in series across the power supply terminal and the ground terminal, and constitute another push-pull type output circuit. Those two push-pull type output circuits are driven in an opposite phase in relation to each other.

In the above-mentioned BTL amplifier according to the present invention, in particular, the direction of the semiconductor regions of the first transistor part and the direction of the semiconductor regions of the third transistor part are parallel to each other. In addition, the direction of the semiconductor regions of the first transistor part and the direction of the semiconductor regions of the second transistor part are perpendicular to each other, and the direction of the semiconductor regions of the third transistor part and the direction of the semiconductor regions of the fourth transistor part are perpendicular to each other.

The transistor constituted by the above-mentioned semiconductor regions, is preferably a NPN transistor. In a further example, the transistor of each of the first and third transistor parts may be a PNP transistor and the transistor of each of the second and fourth transistor parts may be an NPN transistor. Furthermore, the above-mentioned transistor may be an n-channel MOSFET, or the transistor of each of the first and third transistor parts may be a p-channel MOSFET and the transistor of each of the second and fourth transistor parts may be an n-channel MOSFET.

In general, in the BTL amplifier, positions to locate the respective terminals are limited such that the power supply terminal is located apart as far as it can be from any one of the ground terminal and the two output terminals, in order to prevent short-circuiting between the power supply terminal and the other terminals.

On the other hand, in the BTL amplifier according to the present invention, the direction of the semiconductor regions included in the first and third transistor parts and the direction of the semiconductor regions included in the second and fourth transistor parts are perpendicular to each other. In that case, the third and fourth wires are preferably inflected such that the third and fourth wires and any one of the semiconductor regions included in the respective transistor parts are perpendicular to each other. Thus, the first wire falls into place on the first and third transistor parts without crossing with the third and fourth wires. As a result, the first to fourth wires are all located within the rectangular region on which the four transistor parts are mounted. The wire resistances are lower, since the wires of the BTL amplifier according to the present invention are shorter than those of the prior art.

As described above, in the BTL amplifier according to the present invention, since location range of wires is limited within a region on which an output transistor is mounted, the wires are shortened, and as a result, the wire resistances becomes lower. Therefore, power loss is reduced and output power increases. The BTL amplifier according to the present invention can improve both integration degree and output power.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the figures are schematic representations for purposes of illustration and do not necessarily depict the actual relative sizes or locations of the elements shown.

DETAILED DESCRIPTION OF THE INVENTION

Preferred embodiments specifically exemplifying the best mode for carrying out the present invention will be described below referring to the accompanying drawings.

First Preferred Embodiment

Figure 1:
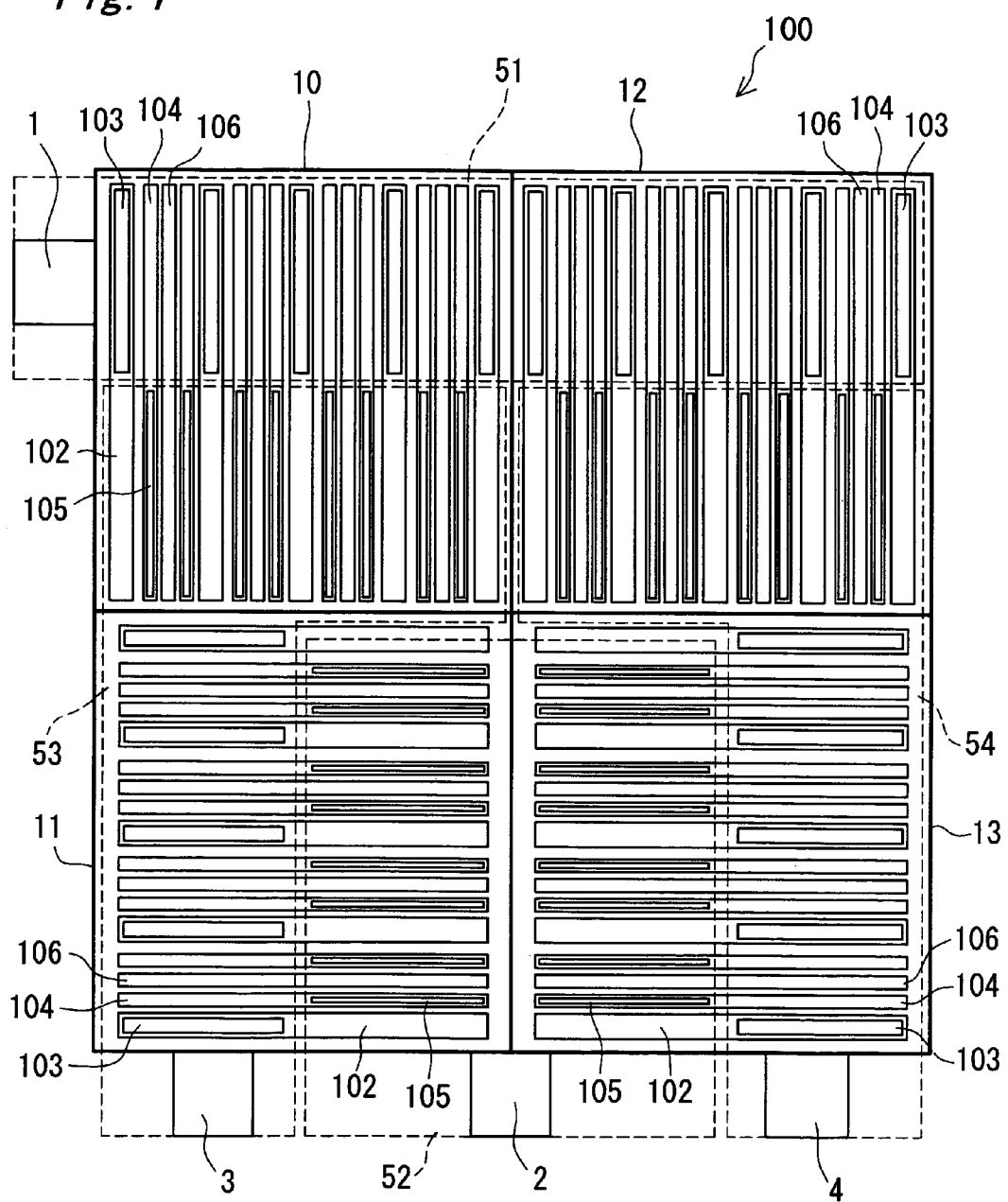
FIG. 1 is a plan view of an output transistor 100 included in a BTL amplifier according to a first preferred embodiment of the present invention.

FIG. 1 is a plan view of an output transistor 100 included in a BTL amplifier according to a first preferred embodiment of the present invention. An output transistor 100 of this BTL amplifier is mounted in a rectangular region on a substrate. The rectangular region is divided into four rectangular parts, or the transistor parts 10, 11, 12 and 13 in lattice patterns.

Each of the transistor parts 10, 11, 12 and 13 is equivalent to a single transistor. In the transistor parts 10 and 12, semiconductor regions 102, 104 and 106 which are longitudinally parallel to each other are provided, and pairs, each constituted by the semiconductor regions 102, 104, 106 and 104 in this sequence, are located repeatedly in a lateral direction. In the transistor parts 11 and 13, semiconductor regions 102, 104 and 106 which are laterally parallel to each other are provided, and pairs, each constituted by the semiconductor regions 102, 104, 106 and 104 in this sequence, are located repeatedly in a longitudinal direction. That is, in the output transistor 100, a direction of the semiconductor regions 102, 104 and 106 in an upper half of the figure (constituted by the transistor parts 10 and 12) of the rectangular region on the substrate and that in a lower half of the figure (constituted by the transistor parts 11 and 13) are perpendicular to each other.

In this first preferred embodiment of the present invention, the semiconductor regions 102, 104 and 106 are n-type semiconductor region, n-type semiconductor region and p-type semiconductor region, and compose a collector region, an emitter region, and a base region of an NPN transistor, respectively. Contacts 103 and 105 are located in the semiconductor regions 102 and 104, respectively.

A power supply terminal 1 is provided at an edge of the transistor part 10. The power supply terminal 1 is connected to an external voltage source (not shown) and is kept at a constant potential. A ground terminal 2 is provided at an edge between the transistor parts 11 and 13. Output terminals 3 and 4 are provided at each edge of the transistor parts 11 and 13. An external load such as a speaker or the like is connected between the output terminals 3 and 4.

As described above, the power supply terminal 1 is provided apart as far as it can be from any of the ground terminal 2 and the two output terminals 3 and 4. Thereby, short-circuiting between the power supply terminal 1 and the other terminals 2, 3 and 4 is prevented.

The four transistor parts 10, 11, 12 and 13 are covered with four wires 51, 52, 53 and 54. These wires 51, 52, 53 and 54 are preferably a metal wire layer made of aluminum or the like and composed by a multi-layer wiring process. The four transistor parts 10, 11, 12 and 13 are connected to the power supply terminal 1, the ground terminal 2, and the two output terminals 3 and 4 through the four wires 51, 52, 53 and 54, as follows.

In the transistor parts 10 and 12 which are laterally adjacent to each other, the collector region 102 is connected to the wire 51 through the contact 103. The wire 51 is connected to the power supply terminal 1. In the transistor parts 11 and 13 which are laterally adjacent to each other, the emitter region 104 is connected to the wire 52 through the contact 105. The wire 52 is connected to the ground terminal 2. The emitter region 104 of the transistor part 10 is connected to the wire 53 through the contact 105, and the collector region 102 of the transistor part 11 is connected to the wire 53 through the contact 103.

The wire 53 is connected to the output terminal 3. The emitter region 104 of the transistor part 12 is connected to the wire 54 through the contact 105, and the collector region 102 of the transistor part 13 is connected to the wire 54 through the contact 103. The wire 54 is connected to the second output terminal 4.

Therefore, the transistor parts 10 and 11 are equivalent to two NPN transistors connected in series across the power supply terminal 1 and the ground terminal 2, and constitute one push-pull type output circuit. In a similar way, the transistor parts 12 and 13 are equivalent to two NPN transistors connected in series across the power supply terminal 1 and the ground terminal 2, and constitute another push-pull type output circuit.

Figure 2:
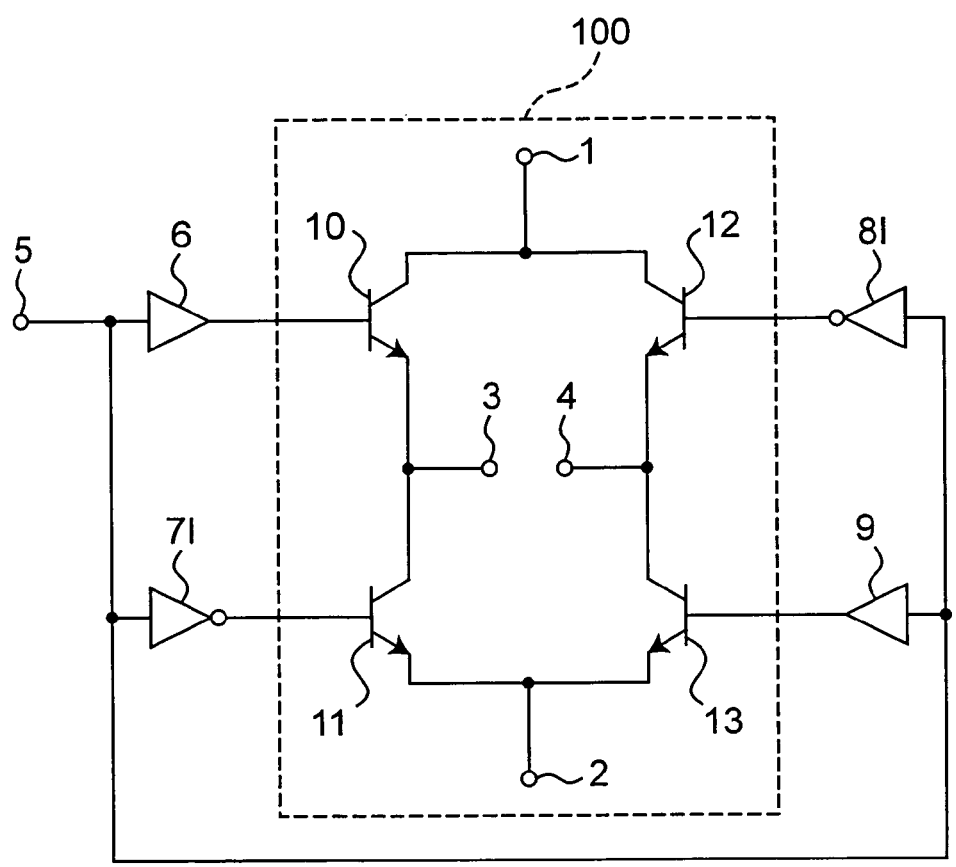
FIG. 2 is an equivalent circuit diagram showing the BTL amplifier according to the first preferred embodiment of the present invention.

FIG. 2 is an equivalent circuit diagram showing the BTL amplifier according to this first preferred embodiment of the present invention. As shown in FIG. 2, the base regions 106 of the four transistor parts 10, 11, 12 and 13 are connected to external preamplifiers 6, 7I, 8I and 9, respectively, through other wires which are different from the four wires 51, 52, 53 and 54. A common control signal is input to the preamplifiers 6, 7I, 8I and 9 from outside through an input terminal 5. A polarity of outputs of the preamplifiers 7I and 8I is opposite to a polarity of outputs of the preamplifiers 6 and 9. Therefore, a push-pull operation for the transistor parts 12 and 13 and that for the transistor parts 10 and 11 are controlled in opposite phase to each other. That is, two push-pull type output circuits are driven in an opposite phase in relation to each other. As a result, the voltage amplitude of an output voltage output across the two output terminals 3 and 4 is twice as large as amplitude of individual electrical potential change of respective output terminals 3 and 4.

As shown in FIG. 1, the direction of the semiconductor regions 102, 104 and 106 included in the transistor parts 10 and 12 and the direction of the semiconductor regions 102, 104 and 106 included in the transistor parts 11 and 13 are perpendicular to each other. In this case, the wires 53 and 54 are inflected such that the wires 53 and 54 and any one of the semiconductor regions 102, 104 and 106 included in each transistor parts 10, 11, 12 and 13 are perpendicular to each other. Therefore, the wire 51 falls into place on the transistor parts 10 and 12 without crossing with the wires 53 and 54.

As described above, the wires 51, 52, 53 and 54 are all provided within the rectangular region on which the four transistor parts 10, 11, 12 and 13 are mounted. Thereby, the wires of the BTL amplifier according to this first preferred embodiment of the present invention are shorter than those of the prior art, and hence the resistance of those wires are lower. For example, in the case that a wire sheet resistance is 50 mΩ, the resistance value of the wire 51 is smaller than that of the prior art by approximately 200 mΩ. As a result, since power loss is reduced, output power increases. For example, in the case that power supply voltage is 3V and load resistance is 8Ω, maximum output power is higher than that of the apparatus of the prior art by approximately 3%.

Second Preferred Embodiment

In the first preferred embodiment, each of all the four transistor parts 10, 11, 12 and 13 includes the NPN transistor. On the other hand, in a second preferred embodiment, each of the transistor parts 10 and 12 includes a PNP transistor instead of the NPN transistor. That is, the semiconductor regions 102, 104 and 106 are p-type semiconductor region, p-type semiconductor region and n-type semiconductor region, and compose an emitter region, a collector region, and a base region of the PNP transistor, respectively (see FIG. 1).

Figure 3:
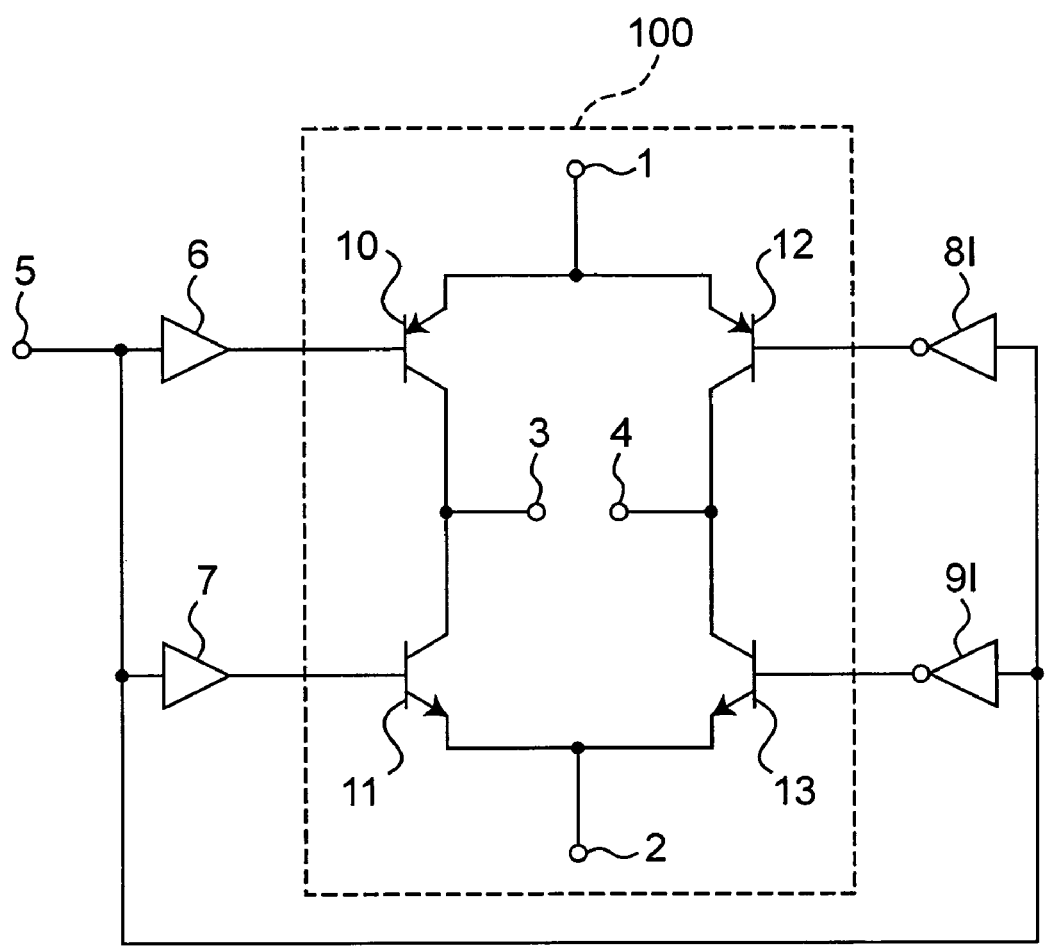
FIG. 3 is an equivalent circuit diagram showing a BTL amplifier according to a second preferred embodiment of the present invention.

FIG. 3 is an equivalent circuit diagram showing a BTL amplifier according to this second preferred embodiment of the present invention. A configuration of the BTL amplifier according to this second preferred embodiment of the present invention is similar to that of the first preferred embodiment other than that the transistor parts 10 and 12 are the PNP transistors, and an emitter and a collector of each of the transistor parts 10 and 12 are inverted. In FIG. 3, the same numeral references as in FIG. 2 are denoted to similar components to those in FIG. 2. Furthermore, the detailed descriptions about those similar components are incorporated in the descriptions of the first preferred embodiment.

The base regions 106 of the four transistor parts 10, 11, 12 and 13 are connected to external preamplifiers 6, 7, 8I and 9I, respectively, through other wires which are different from the four wires 51, 52, 53 and 54. A common control signal is input to the preamplifiers 6, 7, 8I and 9I from outside through an input terminal 5. A polarity of outputs of the preamplifiers 8I and 9I is opposite to a polarity of outputs of the preamplifiers 6 and 7. Therefore, a push-pull operation for the transistor parts 12 and 13 and that for the transistor parts 10 and 11 are controlled in opposite phase to each other. That is, two push-pull type output circuits are driven in opposite phase to each other. As a result, a voltage amplitude of an output voltage output across the two output terminals 3 and 4 is twice as large as amplitude of individual electrical potential change of respective output terminals 3 and 4.

In this second preferred embodiment, in a similar way to the first preferred embodiment, the wires 51, 52, 53 and 54 are all provided within the rectangular region on which the four transistor parts 10, 11, 12 and 13 are mounted. Therefore, in the BTL amplifier according to the second preferred embodiment of the present invention, the resistances of those wires are lower, and as a result, output power increases in a similar way to the apparatus according to the first preferred embodiment of the present invention.

Third Preferred Embodiment

In the first preferred embodiment, each of all the four transistor parts 10, 11, 12 and 13 includes the bipolar transistor. On the other hand, in a third preferred embodiment, each of the transistor parts 10, 11, 12 and 13 includes an n-channel MOSFET. That is, the semiconductor regions 102, 104 and 106 are n-type semiconductor region, n-type semiconductor region, and p-type semiconductor region, and compose a drain region, a source region, and a gate region of the n-channel MOSFET (see FIG. 1). These n-channel MOSFETs may be composed as IGBTs.

Figure 4:
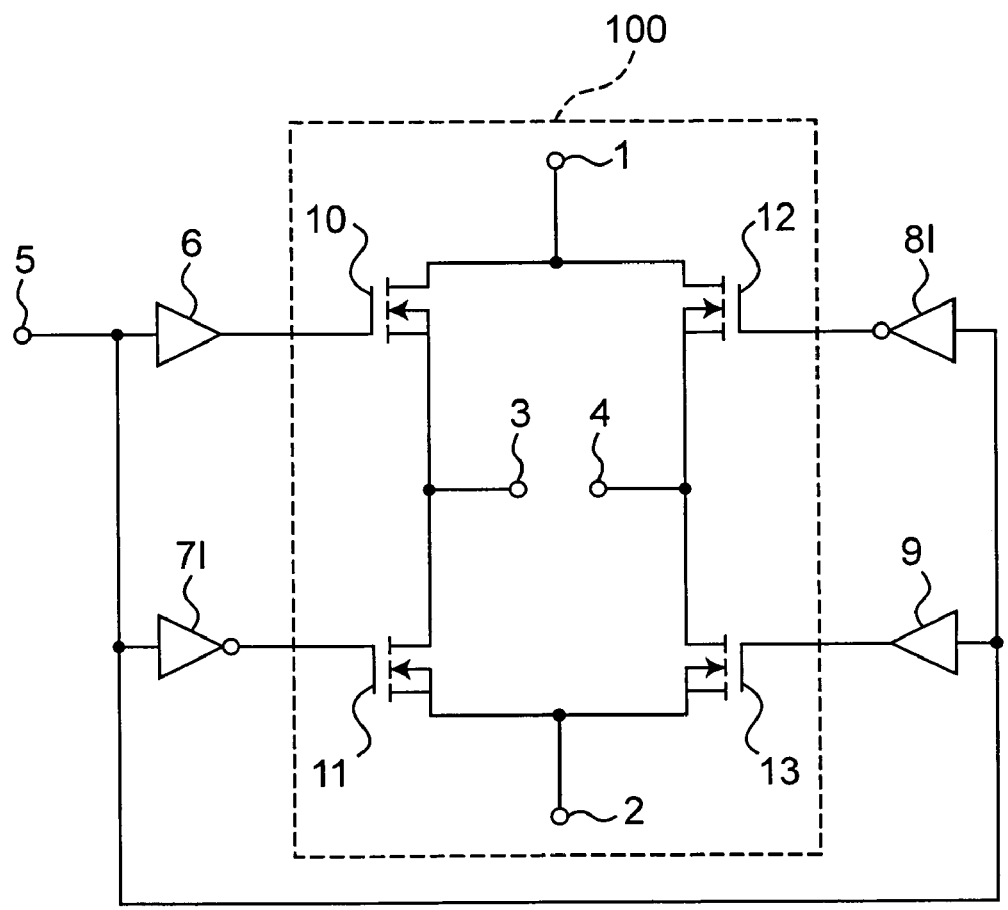
FIG. 4 is an equivalent circuit diagram showing a BTL amplifier according to a third preferred embodiment of the present invention.

FIG. 4 is an equivalent circuit diagram showing a BTL amplifier according to this third preferred embodiment of the present invention. A configuration of the BTL amplifier according to this third preferred embodiment of the present invention is similar to that of the first preferred embodiment other than that the transistor parts 10, 11, 12 and 13 are the n-channel MOSFETs. In FIG. 4, the same numeral references as in FIG. 2 are denoted to similar components to those in FIG. 2. Furthermore, the detailed descriptions about those similar components are incorporated in the descriptions of the first preferred embodiment.

In this third preferred embodiment, in a similar way to the first preferred embodiment, the wires 51, 52, 53 and 54 are all provided within the rectangular region on which the four transistor parts 10, 11, 12 and 13 are mounted. Therefore, in the BTL amplifier according to the third preferred embodiment of the present invention, the resistances of those wires are lower, and as a result, output power increases in a similar way to the apparatus according to the first preferred embodiment of the present invention.

Fourth Preferred Embodiment

In the third preferred embodiment, each of all the four transistor parts 10, 11, 12 and 13 includes the n-channel MOSFET. On the other hand, in a fourth preferred embodiment, each of the transistor parts 10 and 12 includes a p-channel MOSFET instead of the n-channel MOSFET. That is, the semiconductor regions 102, 104 and 106 are p-type semiconductor region, p-type semiconductor region, and n-type semiconductor region, and compose a source region, a drain region, and a gate region of the p-channel MOSFET (see FIG. 1).

Figure 5:
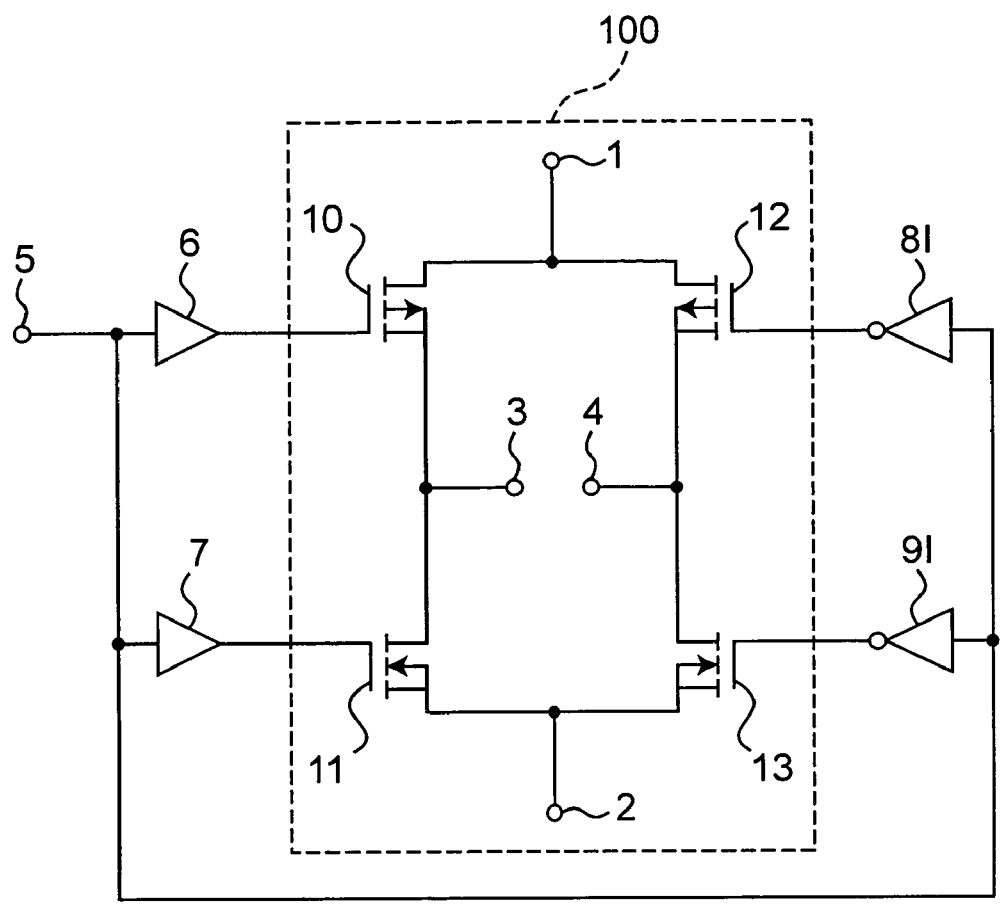
FIG. 5 is an equivalent circuit diagram showing a BTL amplifier according to a fourth preferred embodiment of the present invention.
Figure 6:
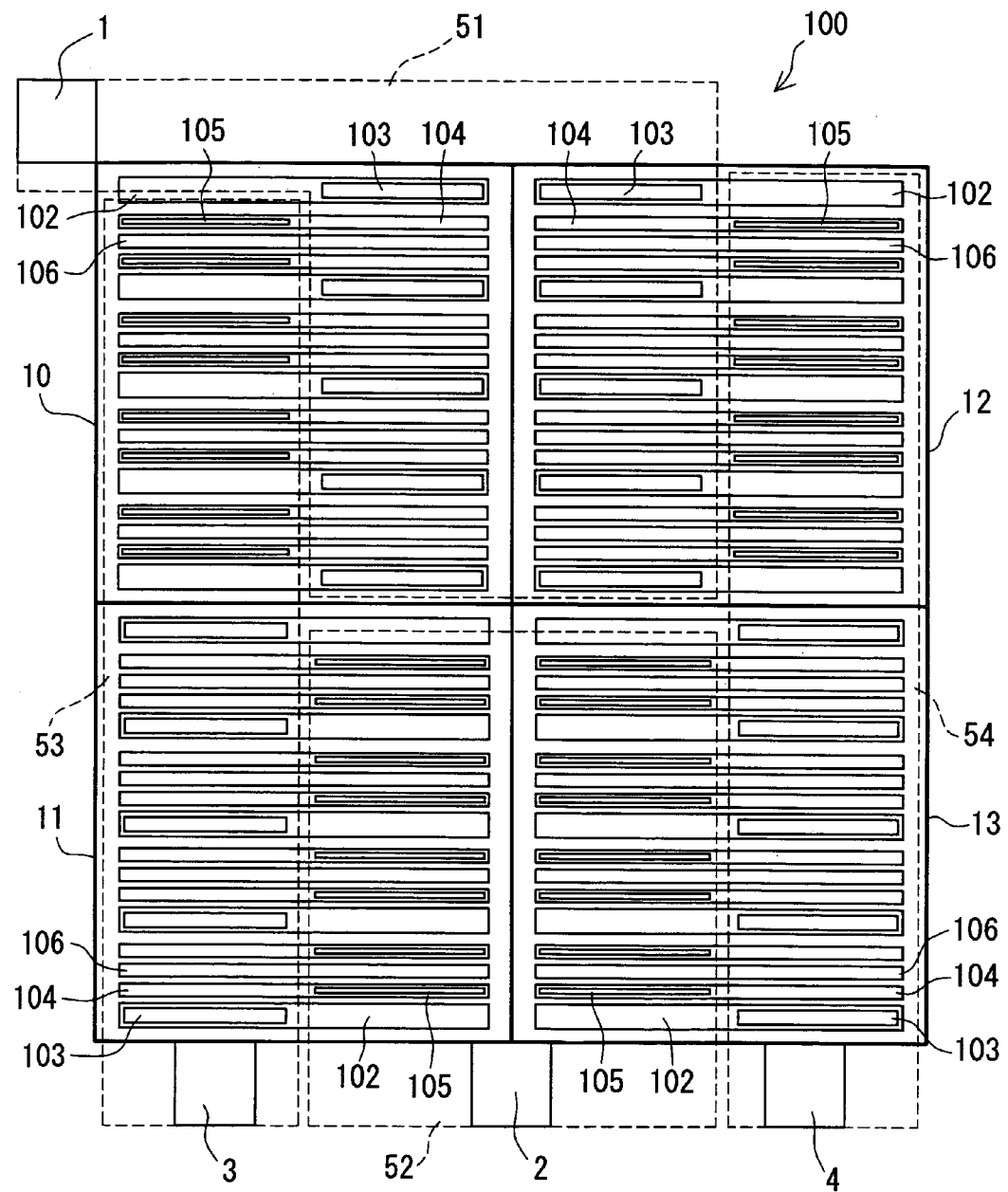
FIG. 6 is a plan view of an output transistor 100 included in a BTL amplifier of a prior art.
Figure 7:
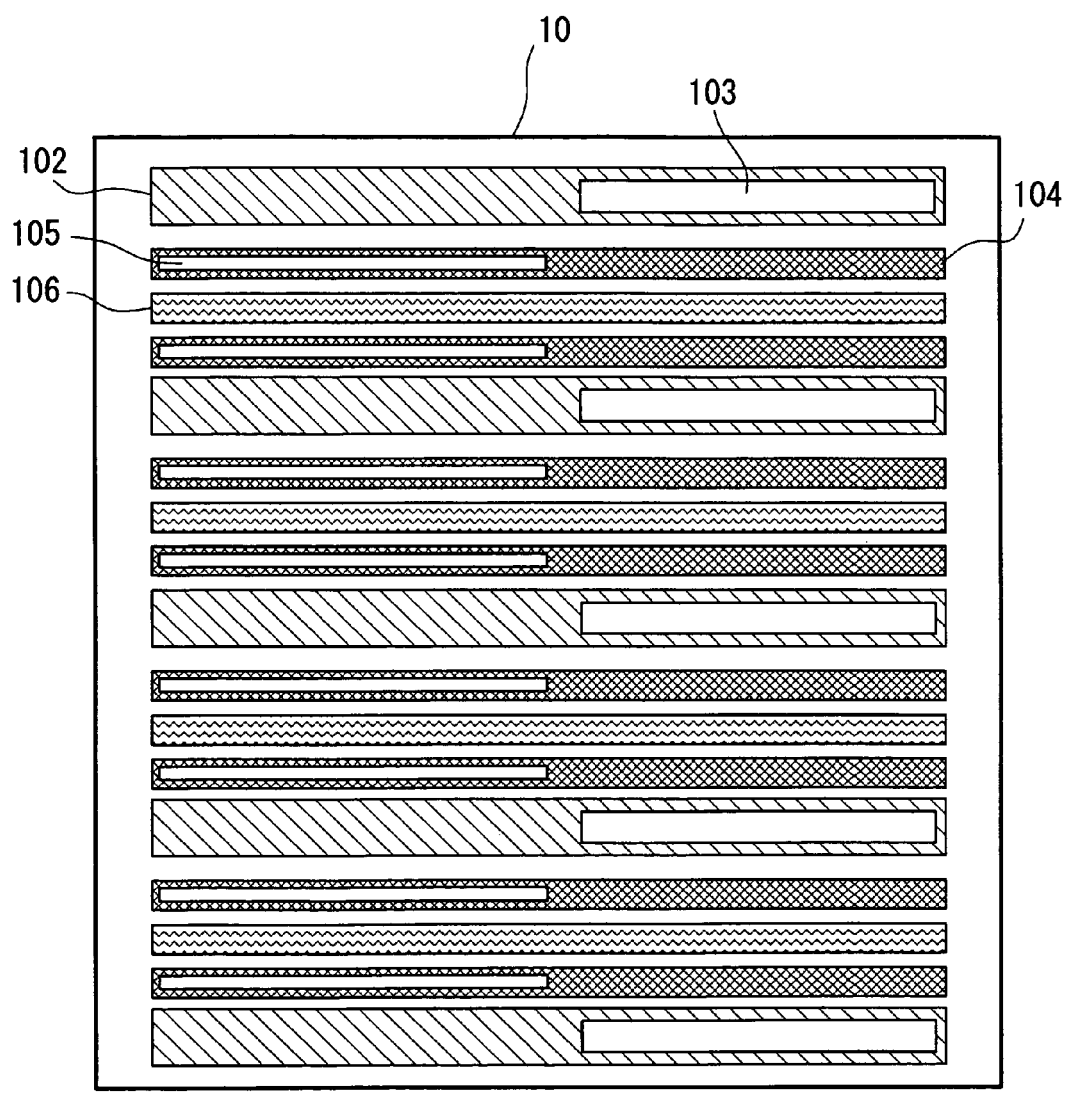
FIG. 7 is a plan view showing a layout of three semiconductor regions 102, 104 and 106 for a transistor part 10 of FIG. 6.

FIG. 5 is an equivalent circuit diagram showing a BTL amplifier according to this fourth preferred embodiment of the present invention. A configuration of the BTL amplifier according to this fourth preferred embodiment of the present invention is similar to that of the third preferred embodiment other than that the transistor parts 10 and 12 are the p-channel MOSFETs, and a drain and a source of each of the transistor parts 10 and 12 are inverted. In FIG. 5, the same numeral references as in FIG. 2 are denoted to similar components to those in FIG. 2. Furthermore, the detailed descriptions about those similar components are incorporated in the descriptions of the first preferred embodiment.

The base regions 106 of the four transistor parts 10, 11, 12 and 13 are connected to external preamplifiers 6, 7, 8I and 9I, respectively, through other wires which are different from the four wires 51, 52, 53 and 54. A common control signal is input to the preamplifiers 6, 7, 8I and 9I from outside through an input terminal 5. A polarity of outputs of the preamplifiers 8I and 9I is opposite to a polarity of outputs of the preamplifiers 6 and 7. Therefore, a push-pull operation for the transistor parts 12 and 13, and that for the transistor parts 10 and 11 are controlled in opposite phase to each other. That is, two push-pull type output circuits are driven in an opposite phase in relation to each other. As a result, a voltage amplitude of an output voltage output across the two output terminals 3 and 4 is twice as large as amplitude of individual electrical potential change of respective output terminals 3 and 4.

In this fourth preferred embodiment, in a similar way to the first preferred embodiment, the wires 51, 52, 53 and 54 are all provided within the rectangular region on which the four transistor parts 10, 11, 12 and 13 are mounted. Therefore, in the BTL amplifier according to this fourth preferred embodiment of the present invention, the resistances of those wires are lower, and as a result, output power increases in a similar way to the apparatus according to the first preferred embodiment of the present invention.

As described above, the BTL amplifier in accordance with the present invention reduces the wire resistance by devising orientation of the semiconductor regions included in the transistor part and shortening the wires to improve both integration degree and output power. The present invention clearly has an industrial applicability.

The disclosure of Japanese Patent Application No. 2004-326939 filed Nov. 10, 2004 including specification, drawings and claims is incorporated herein by reference in its entirety.

Although the present invention has been described with respect to its preferred embodiments in some detail, the disclosed contents of the preferred embodiments may change in the details of the structure thereof, and any changes in the combination and sequence of the component may be attained without departing from the scope and spirit of the claimed invention.

What is claimed is:

1. A BTL amplifier comprising:
    a substrate;
    first, second, third and fourth transistor regions on the substrate which are four rectangular regions substantially dividing a rectangular region on the substrate in lattice patterns, and each of the rectangular regions including a transistor consisting of three n-type or p-type semiconductor regions which are longitudinally or laterally parallel in each rectangular region;
    a power supply interconnection layer;
    a ground interconnection layer;
    first and second output interconnection layers to be connected to an external load;
    a first interconnection layer for connecting the first and the third transistor regions which are adjacent to each other in a lateral direction of the substrate to the power supply interconnection layer;
    a second interconnection layer for connecting the second and the fourth transistor regions which are adjacent to each other in a lateral direction of the substrate to the ground interconnection layer;
    a third interconnection layer for connecting the first and the second transistor regions which are adjacent to each other in a longitudinal direction of the substrate to the first output interconnection layer; and
    a fourth interconnection layer for connecting the third and the fourth transistor regions which are adjacent to each other in a longitudinal direction of the substrate to the second output interconnection layer;
    wherein the direction of the semiconductor regions of the first transistor region and the direction of the semiconductor regions of the third transistor region are parallel to each other,
    wherein the direction of the semiconductor regions of the first transistor region and the direction of the semiconductor regions of the second transistor region are perpendicular to each other, and
    wherein the direction of the semiconductor regions of the third transistor region and the direction of the semiconductor regions of the fourth transistor region are perpendicular to each other.

2. The BTL amplifier claimed in claim 1, wherein the transistor of at least one of the transistor regions is an NPN transistor.

3. The BTL amplifier claimed in claim 1,
    wherein the transistor of each of the first and the third transistor regions is a PNP transistor, and the transistor of each of the second and the fourth transistor regions is an NPN transistor.

4. The BTL amplifier claimed in claim 1, wherein the transistor of at least one of the transistor regions is an n-channel MOSFET.

5. The BTL amplifier claimed in claim 1,
    wherein the transistor of each of the first and the third transistor regions is a p-channel MOSFET, and the transistor of each of the second and the fourth transistor regions is an n-channel MOSFET.

6. The BTL amplifier claimed in claim 1, wherein the transistor of each of the transistor regions is an NPN transistor.

7. The BTL amplifier claimed in claim 1, wherein the transistor of each of the transistor regions is an n-channel MOSFET.

* * * * *